United States Patent [19]

Iwata

[11] Patent Number: 5,453,741

[45] Date of Patent: Sep. 26, 1995

[54] SAMPLING FREQUENCY CONVERTER

[75] Inventor: Toshio Iwata, Sagamihara, Japan

[73] Assignee: Kabushiki Kaisha Kenwood, Tokyo, Japan

[21] Appl. No.: 120,532

[22] Filed: Sep. 14, 1993

[30] Foreign Application Priority Data

Sep. 16, 1992 [JP] Japan .................. 4-270765

[51] Int. Cl.$^6$ .................. H03M 7/00
[52] U.S. Cl. .................. 341/61; 364/724.1
[58] Field of Search .................. 341/122, 123, 341/124, 125, 61; 364/724.1

[56] References Cited

U.S. PATENT DOCUMENTS 5,126,737 6/1992 Torii .................. 341/61
5,191,334 3/1993 Yasuda .................. 341/61

FOREIGN PATENT DOCUMENTS 0466356 1/1992 European Pat. Off. .
2050507 2/1990 Japan .

OTHER PUBLICATIONS

International Journal of Electronics, vol. 71, No. 6, Dec. 1991, London, GB, pp. 939–949, X000275090, R. Aboul–Hosn et al., "Multirate Techniques In Narrow Band Fir Filters".

Primary Examiner—Howard L. Williams
Attorney, Agent, or Firm—Sixbey, Friedman, Leedom & Ferguson; Gerald J. Ferguson, Jr.; Eric J. Robinson

[57] ABSTRACT

A sampling frequency converter of a compact size a for converting input data sampled at a sampling frequency of $M = F * m_1 * m_2, \ldots, * m_k * m_{k+1}$ ($m_1, m_2, \ldots, m_k, m_{k+1}$ are positive integers) into data sampled at a sampling frequency of $N = F * n_1 * n_2, \ldots, * n_k$ ($n_1, n_2, \ldots, n_k$ are positive integers). The converter includes a serial circuit of cascaded n stages of over-sampling filters Vi for over-sampling the input data by an $n_i$-fold (i=1, 2, ..., k) and down-sampling filters Wi for down-sampling the outputs of the over-sampling filters by an $m_i$-fold, and a down-sampling filter $W_{k+1}$ for down-sampling an output of the down-sampling filter at the stage k by an $m_{k+1}$-fold.

1 Claim, 2 Drawing Sheets

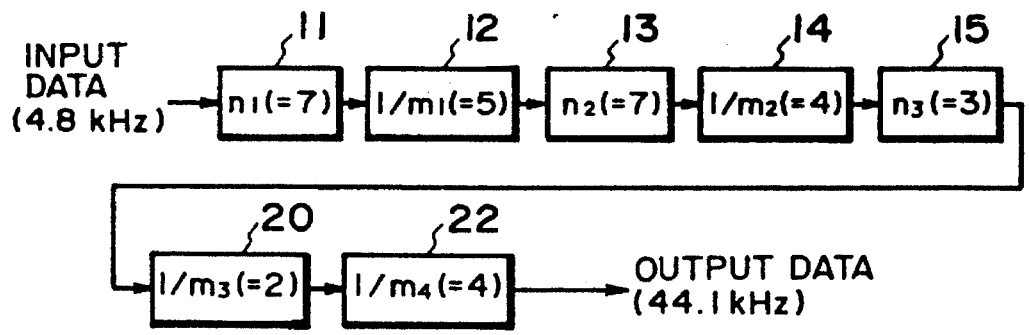
FIG. 1
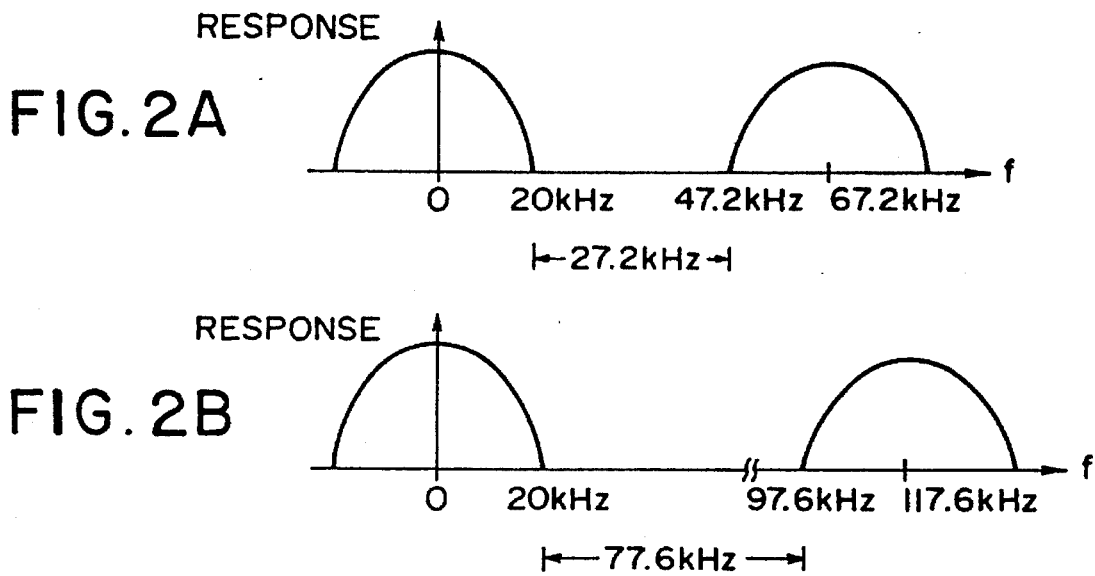
FIG. 2A
FIG. 2B
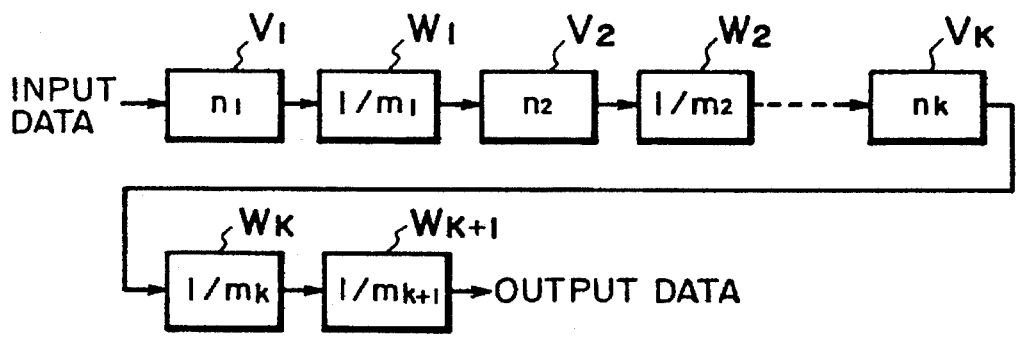
FIG. 3

5,453,741

SAMPLING FREQUENCY CONVERTER

BACKGROUND OF THE INVENTION

1. Field of the Invention

The present invention relates to a sampling frequency converter for converting input data sampled at a sampling frequency of M into data sampled at a sampling frequency of N.

2. Related Background Art

In order to convert input data sampled at a sampling frequency of $M = F * m_1 * m_2, \ldots, * m_k$ ($m_1, m_2, \ldots, m_k$ are positive integers) into data sampled at a sampling frequency of $N = F * n_1 * n_2, \ldots, * n_k$ ($n_1, n_2, \ldots, n_k$ are positive integers), a conventional sampling frequency converter such as shown in FIG. 4 has over-sampling filters Oi for over-sampling the input data by an $n_i$-fold and down-sampling filters Di for down-sampling by an $m_i$-fold.

However, at each stage of pairs of the cascaded over-sampling filters Oi and down-sampling filters Di, the value $n_i/m_i$ may become $n_i/m_i<1$. In this case, the input data is first over-sampled by the $n_i$-hold and then down-sampled by the $m_i$-hold. Therefore, the sampling frequency lowers, and the margin between the upper limit of the signal frequency band and the lower limit of the folded component becomes small. The over-sampling filter at the next stage is therefore required to have a sharp cut-off characteristic, increasing the number of filter taps and the size of hardware.

More specifically, as shown in FIG. 5, consider the conversion of input data sampled at a sampling frequency of 48 kHz into data sampled at a sampling frequency of 44.1 kHz. In this case, M=48 kHz=300 Hz * 5 * 8 * 4, and N=44.1 kHz=300 Hz * 7 * 7 * 3. The number i of stages of the cascaded over-sampling filters and down-sampling filters is three, and F= 300, $m_1$=5, $m_2$=8, $m_3$=4, $n_1$=7, $n_2$=7, and $n_3$=3. The sampling frequency converter is therefore constructed, as shown in FIG. 5, of over-sampling filters 11, 13, and 15, and down-sampling filters 12, 14, and 16.

In the circuit arrangement shown in FIG. 5, at the input side of the second stage over-sampling filter 13, the sampling frequency is 48 kHz * 7/5=67.2 kHz. If the signal frequency bandwidth is 20 kHz, the margin to the lower limit of the folded component is 27.2 (=47.2 −20) kHz as shown in FIG. 6A. At the input side of the third stage over-sampling filter 15, the sampling frequency is 58.8 kHz (=67.2 kHz * 7/8) and the margin to the lower limit of the folded component is 18.8 kHz. As a result, the number of taps of the third stage over-sampling filter 15 becomes greater than the second stage over-sampling filter 13, increasing the size of hardware.

SUMMARY OF THE INVENTION

It is an object of the present invention to provide a sampling frequency converter capable of making the circuit structure compact.

According to an aspect of the present invention, there is provided a sampling frequency converter for converting input data sampled at a sampling frequency of $M = F * m_1 * m_2, \ldots, * m_k * m_{k+1}$ ($m_1, m_2, \ldots, m_k, m_{k+1}$ are positive integers) into data sampled at a sampling frequency of $N = F * n_1 * n_2, \ldots, * n_k$ ($n_1, n_2, \ldots, n_k$ are positive integers), which includes a serial circuit of cascaded n stages of over-sampling filters for over-sampling the input data by an $n_i$-fold (i=1, 2, . . . , k) and down-sampling filters for down-sampling the outputs of the over-sampling filters by an $m_i$-fold, and a down-sampling filter for down-sampling an output of the down-sampling filter at the stage k by an $m_{k+1}$-fold.

According to the sampling frequency converter of the present invention, input data is over-sampled by the over-sampling filter by the $n_i$-fold, and an output of the over-sampling filter is down-sampled by the down-sampling filter by the $m_i$-fold. This sampling by the $n_i/m_i$ is repeated by k times and the down-sampling by the $m_{k+1}$-fold is performed to obtain the sampling frequency converted data.

Because the down-sampling filter is additionally connected to the pair of over-sampling and down-sampling filters at the last stage, the fold numbers of each pair of the over-sampling and down-sampling filters can be set so as to satisfy $n_i/m_i>1$. As a result, the number of taps of the i-th over-sampling filter becomes smaller than that of the (i−1)-th over-sampling filter, reducing the size of hardware circuits.

BRIEF DESCRIPTION OF THE DRAWINGS

FIG. 1 is a block diagram showing the structure of a sampling frequency converter according to an embodiment of the present invention.

FIGS. 2A and 2B are schematic diagrams showing frequency spectra explaining the operation of the embodiment shown in FIG. 1.

FIG. 3 is a block diagram showing a general sampling frequency converter according to the present invention.

DETAILED DESCRIPTION OF THE PREFERRED EMBODIMENTS

Figure 4:
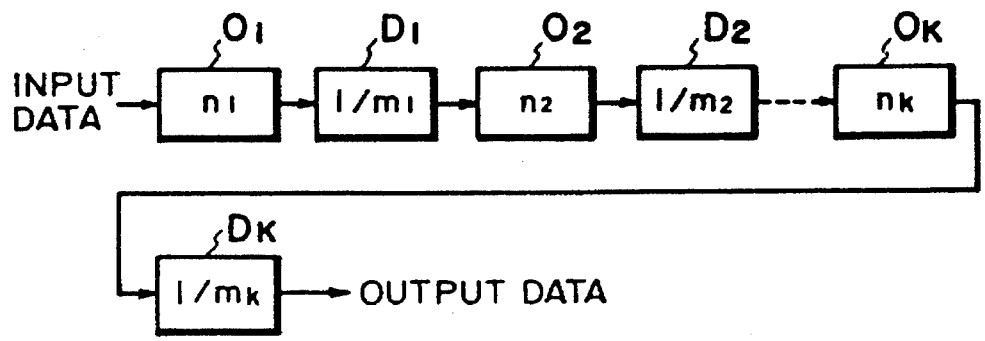
FIG. 4 is a block diagram showing the structure of a conventional sampling frequency converter.
Figure 5:
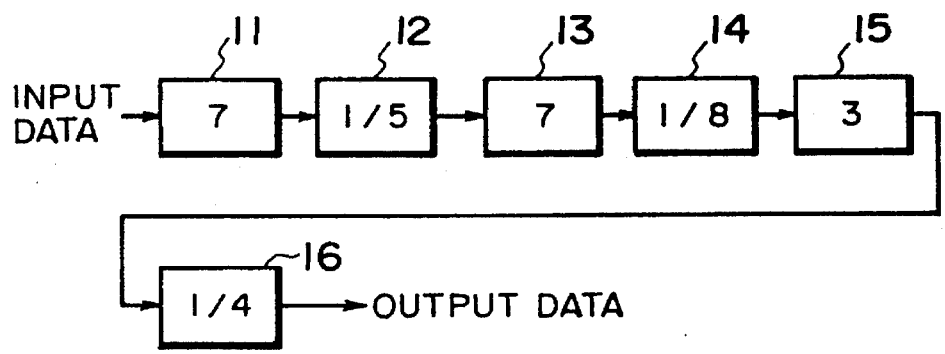
FIG. 5 is a block diagram showing an example of a conventional frequency converter.
Figure 6A:
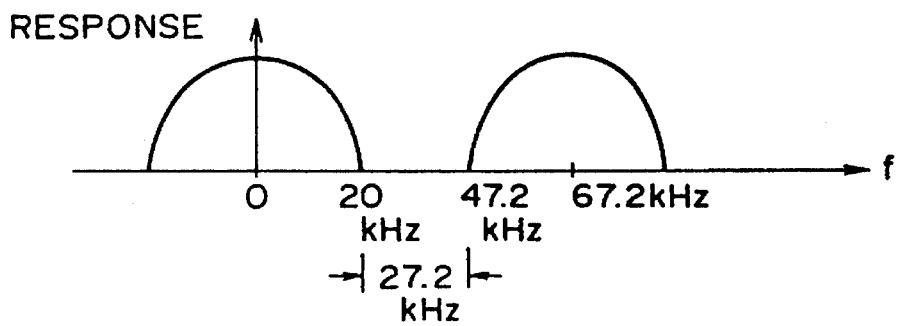
FIGS. 6A and 6B are schematic diagrams showing frequency spectra explaining the operation of converter shown in FIG. 5.
Figure 6B:
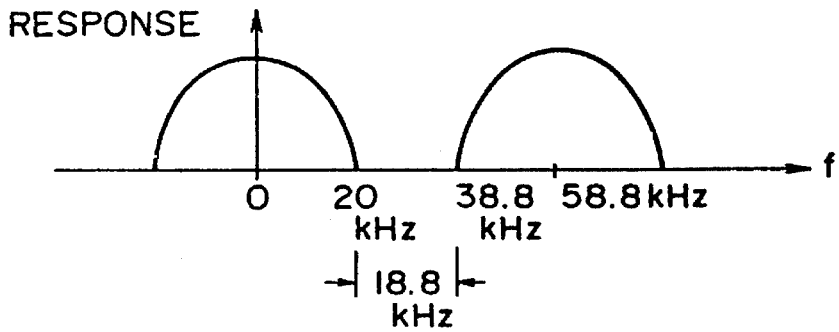

FIG. 1 is a block diagram showing an embodiment of a sampling frequency converter according to the embodiment. In this embodiment, the sampling frequency converter converts input data sampled by a sampling frequency of 48 kHz into data sampled by a sampling frequency of 44.1 kHz, by way of example.

In this embodiment, the sampling frequency M (M= 48 kHz) is factorized as M=300Hz * 5 * 4 * 2 * 4, and the sampling frequency N (N=44.1 kHz) is factorized as N=300 Hz * 7 * 7 * 3. Therefore, i= 3, F=300, $m_1$=5, $m_2$=4, $m_3$=2, $m_4$=4, $n_1$=7, $n_2$= 7, and the number of states of pairs of over-sampling and down-sampling filters is three. In addition, a single down-sampling filter is connected as shown in FIG. 1. The sampling frequency converter is therefore constructed of over-sampling filters 11, 13, and 15, and down-sampling filters 12, 18, 20, and 22. With this arrangement, each pair of over-sampling and down-sampling filters can be set as $n_i/m_i>1$.

The input data sampled by the sampling frequency of 48 kHz is over-sampled by the over-sampling filter 11 by a 7-fold, and then down-sampled by the down-sampling filter 12 by a 5-fold. An output of the down-sampling filter 12 is over-sampled by the over-sampling filter 13 by a 7-fold, and then down-sampled by the down-sampling filter 18 by a 4-fold.

An output of the down-sampling filter 18 is over-sampled by the over-sampling filter 15 by a 3-fold, and then down-sampled by the down-sampling filter 20 by a 2-fold. An output of the down-sampling filter 20 is down-sampled by the down-sampling filter 22 by a 3-fold, and then down-sampled by the down-sampling filter 20 by a 4-fold and outputted therefrom.

As a result, the output of the down-sampling filter 22 has a sampling frequency of 48 kHz * (7/5) * (7/4) * (3/2) * (1/4)=44.1 kHz converted from the sampling frequency of 48 kHz of the input data.

In the sampling frequency converter of this embodiment constructed as above, at the input side of the second stage over-sampling filter 13, the sampling frequency is 48 kHz * 7/5=67.2 kHz. If the signal frequency bandwidth is 20 kHz, the margin to the lower limit of the folded component is 27.2 (=47.2−20) kHz as shown in FIG. 2A. At the input side of the third stage over-sampling filter 15, the sampling frequency is 117.6 kHz (=67.2 kHz * 7/4) and the margin to the lower limit of the folded component is 77.6 kHz.

As a result, the number of taps of the third stage over-sampling filter 15 is relatively small. As compared to the conventional converter described previously, the margin of this embodiment is about four times as the conventional example margin of 18.8 kHz. Therefore, the number of taps of the third stage over-sampling filter 15 is about one fourth the conventional example, reducing the size of circuit configuration.

A general sampling frequency converter, as shown in FIG. 3, for converting input data sampled at a sampling frequency of $M=F * m_1 * m_2, \ldots, * m_k * m_{k+1}$ ($m_1, m_2, \ldots, m_k, m_{k+1}$ are positive integers) into data sampled at a sampling frequency of $N=F * n_1 * n_2, \ldots, * n_k$ ($n_1, n_2, \ldots, n_k$ are positive integers) includes a serial circuit of cascaded n stages of over-sampling filters Vi for over-sampling the input data by an $n_i$-fold (i=1, 2, . . . , k) and down-sampling filters Wi for down-sampling the outputs of the over-sampling filters by an $m_i$-fold, and a down-sampling filter $W_{k+1}$ for down-sampling an output of the down-sampling filter at the stage k by an $m_{k+1}$-fold.

Also in the sampling frequency converter shown in FIG. 3, the condition of $n_i/m_i$ can be satisfied so that a sufficient margin can be obtained between the upper limit of a signal frequency bandwidth and the lower limit of the folded component, and the number of taps of the over-sampling filter and the circuit scale can be reduced.

As described so far, according to the sampling frequency converter of the present invention, the converter is constructed of a serial circuit of cascaded n stages of over-sampling filters for over-sampling the input data by an $n_i$-fold (i=1, 2, . . . , k) and down-sampling filters for down-sampling the outputs of the over-sampling filters by an $m_i$-fold, and a down-sampling filter for down-sampling an output of the down-sampling filter at the stage k by an $m_{k+1}$-fold. Accordingly, the condition of $n_i/m_i$ can be satisfied by all means so that a sufficient margin can be obtained between the upper limit of a signal frequency bandwidth and the lower limit of the folded component, and the number of taps of the over-sampling filter and the circuit scale can be reduced.

What is claimed is:

1. A sampling frequency converter for converting input data sampled at a sampling frequency of $M=F * m_1 * m_2, \ldots, * m_k * m_{k+1}$ ($m_1, m_2 \ldots, m_k, m_{k+1}$ are positive integers) into data sampled at a sampling frequency of $N=F * n_1 * n_2, \ldots, * n_k$ ($n_1, n_2, \ldots, n_k$ are positive integers), comprising:

k stages of sampling frequency conversion units connected in serial, wherein i-th (i=1, 2, . . . k) stage unit of said conversion units comprises one over-sampling filter for increasing the sampling frequency of the data inputted therein by $n_i$-fold and at least one down-sampling filter serially connected after said one over-sampling filter for decreasing the sampling frequency of the data inputted therein by $m_i$-fold, the coefficient $m_i$ for said down-sampling filter being set at a value less than the coefficient $n_i$ for said over-sampling filter, and at least one down-sampling filter serially connected after the final stage of said k stages of sampling frequency conversion units for decreasing the sampling frequency of the data outputted from said final stage by $m_{k+1}$-fold.

\* \* \* \* \*